United States Patent

Nishimoto et al.

[11] Patent Number: 6,156,968
[45] Date of Patent: Dec. 5, 2000

[54] SOLAR CELL, A METHOD OF PRODUCING THE SAME AND A SEMICONDUCTOR PRODUCING APPARATUS

[75] Inventors: Yoichiro Nishimoto; Satoshi Arimoto; Keisuke Namba, all of Tokyo, Japan

[73] Assignee: Mitsubishi Denki Kabushiki Kaisha, Tokyo, Japan

[21] Appl. No.: 09/272,557

[22] Filed: Mar. 19, 1999

Related U.S. Application Data

[62] Division of application No. 08/933,381, Sep. 19, 1997.

[30] Foreign Application Priority Data

Apr. 23, 1997 [JP] Japan ................... 9-105760

[51] Int. Cl.[7] ............................................. H01L 31/0236
[52] U.S. Cl. ................................... 136/252; 136/258
[58] Field of Search ............................ 136/252, 250, 136/256, 258

[56] References Cited

U.S. PATENT DOCUMENTS

| | | | |
|---|---|---|---|
| 5,098,482 | 3/1992 | Warfield | 136/259 |
| 5,356,488 | 10/1994 | Hezel | 136/256 |
| 5,370,747 | 12/1994 | Noguchi et al. | 136/259 |
| 5,672,214 | 9/1997 | Arthur et al. | 136/250 |
| 5,792,280 | 8/1998 | Ruby | 136/258 |
| 5,817,396 | 10/1998 | Perlo et al. | 428/141 |

FOREIGN PATENT DOCUMENTS

B2-7105518 11/1995 Japan .
10-313128 11/1998 Japan ................... H01L 31/04
10313128 11/1998 Japan .

OTHER PUBLICATIONS

Inomata et al., "Surface Texturing of Large Area Multicrystalline Silicon Solar Cells using Reactive Ion Etching Method," Technical Digest, 9th International Photovoltaic Science and Engineering Conference, Nov. 11–15, 1996, pp. 109–110.

Machida et al., "Development of Low Cost Production Technologies for Polycrystalline Silicon Solar Cells," Technical Digest, 9th International Photovoltaic Science and Engineering Conference, Nov. 11–15, 1996, pp. 9 102.

H.S. Rauschenbach, "Solar Cell Array Design Handbook", Van Nostrad Reinhold Company, NY, p. 161, 1980.

*Primary Examiner*—Ellis Robinson
*Assistant Examiner*—Michael C. Miggins
*Attorney, Agent, or Firm*—Birch, Stewart, Kolasch & Birch, LLP

[57] ABSTRACT

In preparing a solar cell, minute projections and recesses are uniformly formed in a surface of a single crystal silicon substrate or a polycrystal silicon substrate by dipping in an etching liquid composed of a mixed acid which is composed mainly of a hydrofluoride acid, a nitric acid and a phosphoric acid in addition to a surface active agent. A solar cell having a substrate in which spherical projections and recesses are formed in a surface of it to which light is incident; an apparatus for producing efficiently a solar cell by realizing the above-mentioned process, and a wet etching apparatus to effect stably the above-mentioned process to thereby maintaining a concentration of a nitric acid to be constant, are provided.

3 Claims, 13 Drawing Sheets

SOLAR CELL, A METHOD OF PRODUCING THE SAME AND A SEMICONDUCTOR PRODUCING APPARATUS

This application is a divisional of copending application Ser. No. 08/933,381, filed on Sep. 19, 1997, the entire contents of which are hereby incorporated by reference.

BACKGROUND OF THE INVENTION

1. Field of the Invention

The present invention relates to a solar cell of high efficiency, a method of producing the same and an apparatus for producing a semiconductor.

2. Discussion of Background

In order to obtain a silicon solar cell of high efficiency it is essential to form minute projections and recesses in a substrate surface so that incident light entering from the substrate surface can be efficiently taken inside the solar cell. Various methods have been proposed to realize such solar cell.

In a solar cell of single crystal silicon, minute pyramidal projections and recesses called a texture structure are formed by a wet etching method using an aqueous alkali solution such as caustic soda, caustic potash or the like. Because the texture structure is constituted by many inclined planes, light reflected at a surface hits a surface of another position and re-enters into the inside whereby the light is absorbed efficiently in the solar cell. A part of the incident light reaches the rear surface without being absorbed in the substrate. Such light is reflected at the rear surface to reach again the front surface where the texture structure is formed. Accordingly, the light is reflected again at an inclined plane and confined in the solar cell. Thus, a substantial part of light is absorbed in the solar cell to thereby improve the characteristics of the solar cell. However, this technique utilizes a difference of etching rate at crystal planes in a silicon crystal. Namely, the etching rate obtained when using an aqueous alkali solution is fastest at a (100) plane of silicon and slowest at a (111) plane. Accordingly, when etching is initially effected to a (100) plane and if a (111) plane is subsequently produced due to any incident during the etching process, the (111) plane delays the etching rate and remains in the surface as a dominant plane.

Since the (111) plane has an inclination of about 54 degree to the (100) plane, pyramidal projections each constituted by only (111), (111) and (111) planes which are equivalent to the (111) plane are formed at the final stage of the process. The process will be described in more detail below. A substrate of silicon having a (100) plane at its surface is dipped in an aqueous solution of caustic potash or caustic soda having a concentration of from several % to 10 and several % heated to 60° C. to 95° C. for 10 min to 30 min. In some cases, isopropyl alcohol of 5% to 30% by volume per an aqueous alkali solution may be added. After the dipping, the substrate is taken out and is washed with water.

In a case of using a substrate of polycrystal silicon which has a variety of directions of crystal in a plane, a pyramidal structure is formed perpendicular to the (100) plane. Accordingly, planes appearing in the front surface are in random directions, and a sufficient light confining effect as obtained in the substrate of single crystal cannot be expected. Further, when the etching liquid having the above-mentioned composition is used, the depth of etching varies depending on the plane directions exposed at the front surface. Thus, steps which do not provide an antireflection effect and prohibits formation of effective electrodes are produced.

Accordingly, various techniques of forming the texture structure have been studied for the substrate of polycrystal silicon, other than the etching method using an aqueous alkali solution for the silicon substrate of single crystal. Further, the conventional method requires a long time for the treatment and is not high in productivity. For example, the conventional method requires a treating time of about 30 min in order to form stably a texture structure in the substrate of single crystal silicon dipped in an etching liquid prepared by adding isopropyl alcohol of 30% by volume to a 1% aqueous potassium hydroxide solution, which is heated to 90° C.

As a first example, there is proposed a method disclosed in Japanese publication JP-B-7-105518 wherein a projection/recess structure is formed by forming mechanically V-like grooves in the front surface of a solar cell of polycrystal silicon. FIG. 13 shows in cross section the structure formed in this example.

As a second example, there is proposed a method disclosed in 9th International Photovoltaic Science and Engineering held on 11 to 15, November, 1996 wherein a pyramidal structure is formed in the front surface of a solar cell of polycrystal silicon by an etching method called RIE (Reactive Ion Etching). FIG. 14 shows a microphotograph of a projection/recess structure formed by RIE.

The detail of the above-mentioned examples will be described.

In the method of mechanically forming the V-like grooves in the first example, a plurality of rotating blades in which material having a hardness higher than silicon, such as diamond, silicon carbide or the like is embedded, are pushed to the silicon substrate, and the rotating blades are dragged on the substrate to thereby form the V-like grooves in the surface of the substrate. The pitch of the V-like grooves is generally in a range of from several hundred $\mu$m to several mm, which is adjustable by adjusting the distance of the blades. The depth of the V-like grooves is generally from several ten $\mu$m to 100 $\mu$m. After mechanically forming the grooves, the substrate is dipped in a solution such as an aqueous alkali solution or the like which is capable of etching silicon whereby a defective crystal layer produced in an area to where the blades have been in mechanical contact, is removed.

In the method of forming projections and recesses by RIE as in the second example, a chlorine gas is used as an etching gas, and silicon is reacted with chlorine ions and chlorine radicals produced by plasma under a reduced pressure to form a chloride of silicon so that the silicon is removed by evaporation. Although the mechanism of forming the projection/recess structure is unclear because the publication fails to disclose it, it is supposed that a part of the silicon chloride as a reaction product remains in the front surface because the etching is conducted without using an etching mask, and cylindrical projections are formed by utilizing the reaction product as a micro-mask. After the formation of the projection/recess structure in the front surface, the substrate is subjected to a wet type cleaning so that the reaction product remaining on the front surface is removed. Thus, a series of treatments is finished.

The conventional method of forming mechanically the V-like grooves requires grinding treatment for each wafer, and presents a problem in large scale production. Further, the conventional techniques requires a step of removing the defective layer by the wet type etching because there was a defect in the surface portion of crystal when the V-like grooves were formed. In order to obtain effectively a light confining effect, it is necessary to form deep V-like grooves. However, the grooves cannot be formed with a small distance because the pitch of the V-like grooves is restricted by the pich of the rotating blades. On the other hand, the substrate has to be thin in order to reduce the cost of material. Accordingly, a crack may be produced in the substrate, or breakage may be caused during manufacturing steps when deep grooves are formed in the substrate.

In the method by using RIE, the problem of producing a defective crystal as in the case of forming the V-like grooves can be avoided. However, there are problems such as a high manufacturing cost due to use of a vacuum device and a poor productivity due to a small performance of treatment.

SUMMARY OF THE INVENTION

It is an object of the present invention to provide a silicon solar cell having a high light confining effect wherein a minute projection/recess structure is formed in a silicon substrate plane of single crystal or polycrystal by a wet type etching.

It is an object of the present invention to provide a method of producing a silicon solar cell with high productivity.

Further, it is an object of the present invention to provide an apparatus for producing a silicon solar cell.

In accordance with a first aspect of the present invention, there is provided a method of producing a solar cell characterized by preparing an aqueous solution of mixed acid of hydrofluoric acid, nitric acid and an adjusting agent containing at least phosphoric acid or a water-soluble carboxylic acid having a small member of carbon atoms which is capable of adjusting an etching rate, and dipping a silicon substrate in the aqueous solution of mixed acid as an etching liquid whereby minute projections and recesses are formed in a surface of the silicon substrate.

In the method of producing a solar cell according to a second aspect of the present invention, the adjusting agent is in a predetermined amount for effecting etching at a high rate in a stable manner without changing a shape obtained by etching.

In the method of producing a solar cell according to a third aspect of the present invention, ammonium fluoride is added to the aqueous solution of mixed acid to form an etching liquid.

In the method of the producing a solar cell according to a fourth aspect of the present invention, the carboxylic acid is composed of at least one selected from the group consisting of propionic acid, butyric acid, valoric acid, caproic acid, tartaric acid, succinic acid, adipic acid, propane-tricarboxylic acid and an isomer of propane-tricarboxylic acid.

In the method of producing a solar cell according to a fifth aspect, a surface active agent is added to the aqueous solution of mixed acid to prepare an etching liquid.

In the method of producing a solar cell according to a sixth aspect, the surface active agent is composed of at least one selected from the group consisting of a nonionic surface active agent, an anionic surface active agent and a cationic surface active agent.

In the method of producing a solar cell according to a seventh aspect, the silicon substrate is dipped in an aqueous caustic alkali solution after the etching treatment has been conducted with the aqueous solution of mixed acid.

In the method of producing a solar cell according to an eighth aspect, the aqueous caustic alkali solution is an aqueous solution of caustic potash or caustic soda having a concentration of 1 to 50%, which is used under a temperature condition in a range of from the room temperature to 95° C.

In accordance with a ninth aspect of the present invention, there is provided a method of producing a solar cell characterized by preparing an aqueous solution of mixed acid of hydrofluoric acid, nitric acid and an adjusting agent containing phosphoric acid or a water-soluble carboxylic acid having a carbon atom number of 3 to 6 which is capable of adjusting an etching rate; dipping a silicon substrate in the aqueous solution of mixed acid as an etching liquid; and dipping the silicon substrate in a mixed water solution of caustic alkali and isopropyl alcohol.

In the method of producing a solar cell according to a tenth aspect of the invention, a plurality of silicon substrates undergo an etching treatment in a state that the rear surfaces of the substrates are contacted with each other.

In accordance with an eleventh aspect of the present invention, there is provided a solar cell comprising a substrate of single crystal or polycrystal, the solar cell being characterized in that a spherical recess wherein the ratio of the depth to the diameter is in a range of from 0.2 to 0.45 is continuously formed in a surface of the substrate.

In the solar cell according to a twelfth aspect of the invention, the spherical recess as in the eleventh aspect is continuously formed in at least a surface to which light is incident.

In accordance with a thirteenth aspect of the present invention, there is provided a solar cell comprising a substrate of single crystal or polycrystal, the solar cell being characterized in that spherical recesses wherein the ratio of the depth to the diameter is in a range of from 0.2 to 0.45, and minute pyramidal projections and recesses are formed in a surface of the substrate.

In accordance with a fourteenth aspect of the present invention, there is provided an apparatus for producing a semiconductor which is composed of an etching device in which a silicon substrate is dipped in an etching liquid composed of an aqueous solution of mixed acid of hydrofluoric acid, nitric acid and an adjusting agent containing phosphoric acid or a water-soluble carboxylic acid having a carbon atom number of 3 to 6, and a detecting means for detecting a concentration of the nitric acid in the aqueous solution of mixed acid.

In the apparatus for a producing a semiconductor according to a fifteenth aspect of the invention, a nitric acid supply means is provided to control an amount of the nitric acid to maintain a concentration of the nitric acid to be in a predetermined range.

In accordance with a sixteenth aspect of the present invention, there is provided an apparatus for producing a semiconductor which is composed of an etching device in which a silicon substrate is dipped in an etching liquid composed of an aqueous solution of mixed acid of hydrofluoric acid, nitric acid and an adjusting agent containing at least phosphoric acid or a water-soluble carboxylic acid having a carbon atom number of 3 to 6 which is capable of adjusting an etching rate, and a substrate holder for holding the silicon substrate in an upright direction when the silicon substrate is etched in the etching device.

In accordance with a seventeenth aspect of the present invention, there is provided an apparatus for producing a semiconductor which is composed of an etching device in which a silicon substrate is dipped in an etching liquid composed of an aqueous solution of mixed acid of hydrofluoric acid, nitric acid and an adjusting agent containing at least phosphoric acid or a water-soluble carboxylic acid having a carbon atom number of 3 to 6 which is capable of adjusting an etching rate, and a substrate holder for holding a plurality of silicon substrates in an upright direction with the rear surfaces of the silicon substrates in mutual contact when the silicon substrate is etched in the etching device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
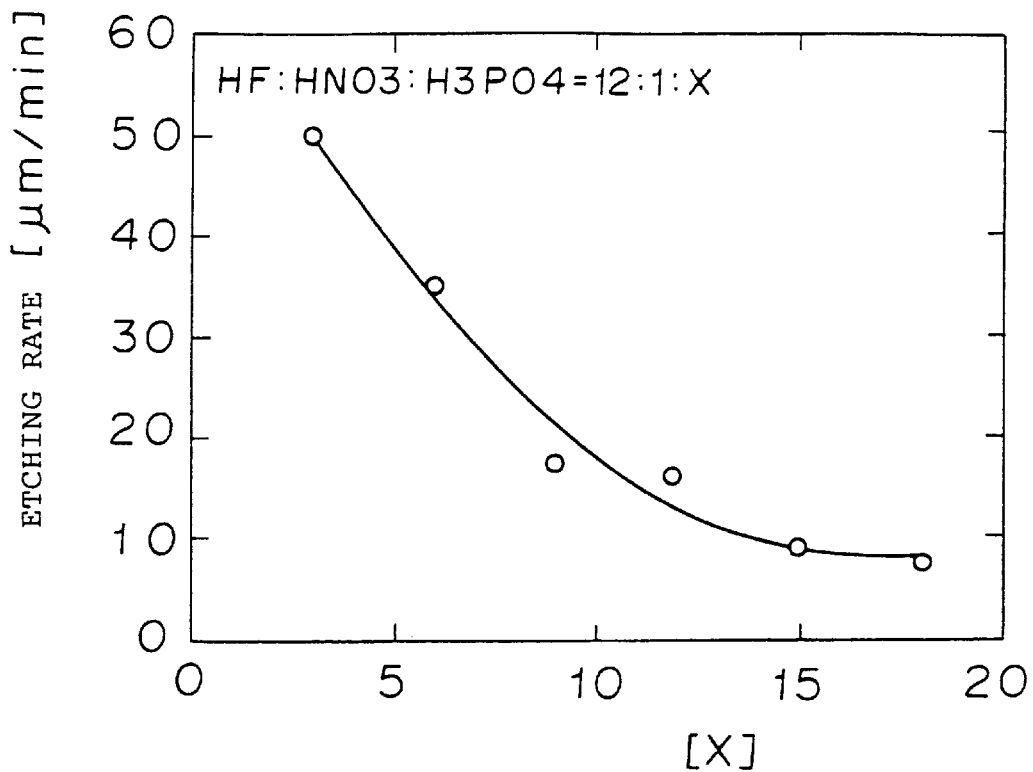
FIG. 1 is a graph showing a relation of an etching rate to a concentration of phosphoric acid.

Preferred embodiments according to the present invention will be described with reference to the drawings wherein the same reference numerals designate the same or corresponding parts.

Embodiments 1

The basic method of treating a silicon substrate according to the present invention, is to dip the silicon substrate in an etching liquid of mixed acid containing hydrofluoric acid, nitric acid and phosphoric acid as major components to thereby form minute projections and recesses in a surface of the silicon substrate.

The detailed description of this embodiment will be described.

A silicon substrate produced by a casting method is dipped in a mixed solution comprising a 50% hydrofluoric acid, a 69% nitric acid and a 85% phosphoric acid in the proportions of 12 parts by volume, 1 part by volume and 12 parts by volume for a time to obtain a predetermined amount of etching while the mixed solution is maintained at the room temperature. After the etching, the substrate is quickly taken up from the etching liquid to be transferred to a water tank filled with washing water, in which washing is conducted by feeding water to remove the etching liquid on the substrate. A brown or black-colored deposit may remain on the substrate surface after the washing treatment. In this case, washing with water is repeated by dipping the substrate in an aqueous caustic soda solution having a concentration of from several % to several ten % for several sec to several min.

The silicon substrate is formed in a casting mold. However, the silicon substrate may be produced by another process other than the casting method.

The concentration of the mixed aqueous solution is indicated by percent by weight to water as a medium. When water is added to the above-mentioned 50% hydrofluoric acid, 69% nitric acid and 85% phosphoric acid to lower the concentration, it is difficult to form stably a predetermined shape by the etching.

The cast polycrystal silicon substrate is produced by cutting a silicon block formed by cooling and solidifying molten silicon into a sheet of several hundred $\mu m$ thick with a wire saw. Accordingly, before the silicon substrate is put in a solar cell manufacturing process, it is necessary to remove by etching a damaged layer of a thickness of about 10 $\mu m$ which is formed by the cutting process. When the silicon substrate is dipped in the etching liquid comprising the above-mentioned composition, etching is conducted at an etching rate of about 15 $\mu m/min$ and the damaged layer sufficiently can be removed within about 1 min. Further, the minute projections and recesses can be formed by the same process, and a minute projection/recess structure is formed in the substrate surface after the etching treatment.

In this case, since the substrate is etched at a uniform etching rate in a level of crystal grain size, there is no risk of forming step portions or shoulder portions in the substrate surface which might be caused due to a difference of etching rate depending on the orientations of crystal, unlike the conventional technique in which an etching liquid of alkali is used. Further, a brown or black-colored deposit, if remains, can be completely removed by a subsequently conducted etching treatment with an aqueous alkali solution.

By using the aqueous solution of mixed acid prepared by mixing predetermined amounts of hydrofluoric acid, nitric acid and phosphoric acid to etch the damaged layer, minute projections and recesses are continuously formed in the silicon substrate surface. With the projection/recess structure thus formed, light reflected at the front surface of the substrate is again incident into the inside of it. Further, there is a portion of light being incident into the solar cell and being reflected at the rear surface. Such portion of light is again reflected at inclination planes in the substrate surface to be incident into the inside. Thus, the substantial amount of light is confined in the solar cell. Accordingly, light is absorbed by the solar cell to thereby improve the performance of the solar cell.

The shape of the substrate surface after the etching depends on a ratio in volume of hydrofluoric acid and nitric acid. In order to form minute projections and recesses in the silicon substrate surface, it is suitable that a 50% hydrofluoric acid is from 10 to 50 parts by volume per part of a 69% nitric acid. Further, by using phosphoric acid in comparison with the conventional technique, it is possible to adjust the etching rate without causing a change of the shape of the substrate surface.

FIG. 1 is a graph showing an etching rate in a case of changing an amount of phosphoric acid to be added. The etching rate is decreased with increasing an amount of phosphoric acid to be added, and it shows a constant value of 10 $\mu$m/min when the amount exceeds 12 parts. It has been found for a cast polycrystal silicon substrate having a damaged layer that a target quantity of etching is 10 to 15 $\mu$m. It is therefore preferable to determine a treating time to be about 1 min so that the treatment can be conducted stably under easy administration of time with good reproducibility. Accordingly, in this case, an amount of phosphoric acid to be added is determined to be about 8 parts or more so that the etching rate is within a range of from 10 to 15 $\mu$m/min.

Figure 2:
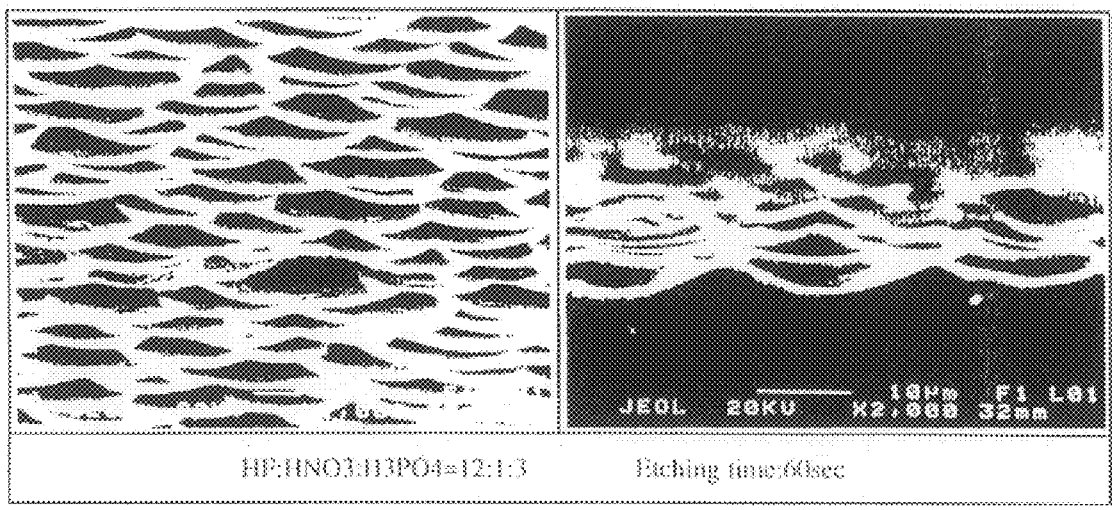
FIG. 2 is a diagram showing the correspondence of the shape of a substrate surface to a concentration of phosphoric acid ($HF:HNO_3:H_3PO_4=12:1:3$) according to the present invention.
Figure 3:
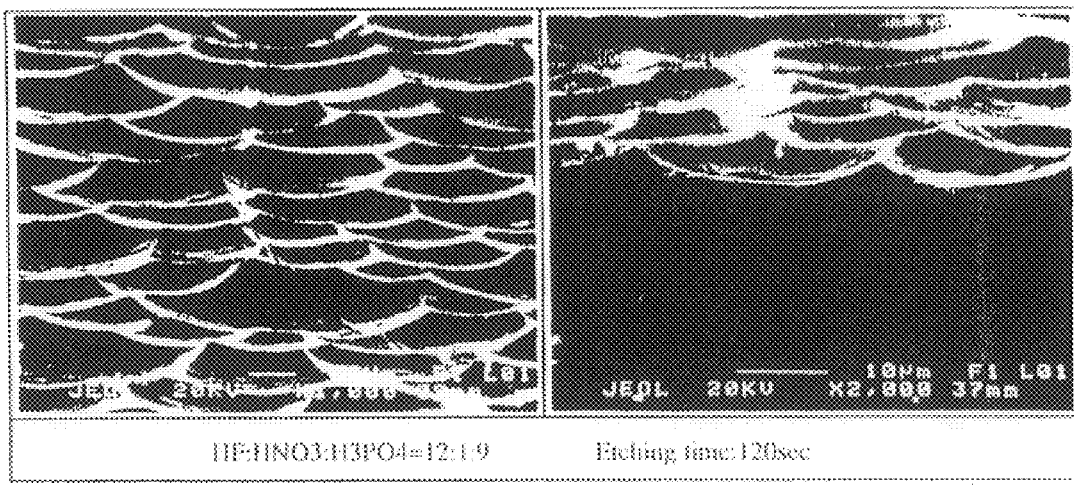
FIG. 3 is a diagram showing the correspondence of the shape of a substrate surface to a concentration of phosphoric acid ($HF:HNO_3:H_3PO_4=12:1:9$) according to the present invention.
Figure 4:
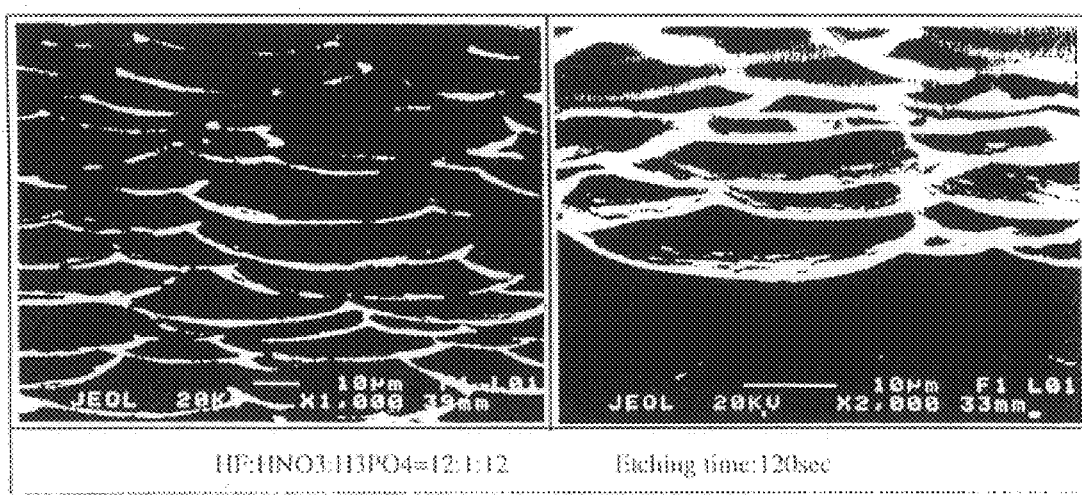
FIG. 4 is a diagram showing the correspondence of the shape of a substrate surface to a concentration of phosphoric acid ($HF:HNO_3:H_3PO_4=12:1:12$) according to the present invention.

FIGS. 2 to 4 are respectively perspective views and cross-sectional views of projection/recess structures at the substrate surface, which show the correspondence of the projection/recess structure at the substrate surface to a concentration of phosphoric acid.

FIG. 2 shows a case that phosphoric acid of 3 parts is added and the treating time is 60 sec; FIG. 3 shows a case that phosphoric acid of 9 parts is added and the treating time is 120 sec; and FIG. 4 shows a case that phosphoric acid of 12 parts is added and the treating time is 120 sec. As is clear from the Figures, a similar shape of the substrate surface is obtainable regardless of an amount of phosphoric acid added. In FIG. 3, a curved line as seen in the central portion of the perspective view indicates a crystal grain boundary. A step or shoulder portion cannot be found at both sides of the crystal grain boundary. This means that the etching rate was kept constant regardless of the orientations of crystal. The phosphoric acid used in this embodiment performs to adjust the etching rate without changing the shape by the etching.

Thus, in accordance with this embodiment, a projection/recess structure can be formed quickly under an easy control whereby a solar cell capable of controlling reflection of light at the substrate surface can be realized.

In this embodiment, phosphoric acid is used as an adjusting agent which provides a stable treatment at a high rate to thereby increase productivity, without a substantial influence to the shape of the substrate surface by an etching treatment. However, another kind of acid having a high molecular weight may be used for the phosphoric acid.

Another Example will be described.

In the case of the cast polycrystal silicon substrate, there is a large change in the orientations of crystal at both sides of the crystal grain boundary. Since FIGS. 2 to 4 show that there is no large step of shoulder portion at both sides of the grain boundaries, it is understood that etching has been conducted uniformly. If the etching rate depends on the orientations of crystal, a step or shoulder portion is formed around the grain boundary. Since the etching rate depends on the orientations of crystal, particularly, in a case of alkali etching, a shoulder portion is formed around grain boundary.

In attempt of adding a water-soluble carboxylic acid having a higher molecular weight than acetic acid instead of phosphoric acid, it has been found that it performs to adjust the etching rate without changing the shape by the etching in the same manner as a case of using phosphoric acid. Carboxylic acid having a large number of carbon atoms is difficult to dissolve in water, and carboxylic acid having a carbon atom number of about 3 to 6 is water-soluble.

Figure 5:
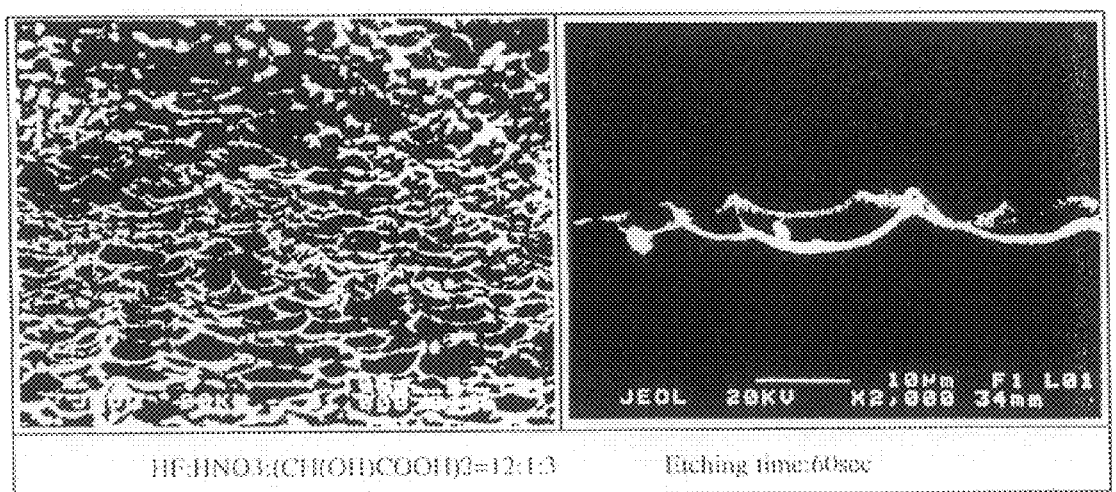
FIG. 5 is a diagram showing a projection/recess structure at a substrate surface wherein a tartaric acid is incorporated, according to the present invention.

As an example of the carboxylic acid to be effective, there is propionic acid, butyric acid, valeric acid, caproic acid, tartaric acid, succinic acid, adipic acid, propane-tricarboxylic acid or an isomer of propane-tricarboxylic acid. FIG. 5 shows an example of a projection/recess structure at the substrate surface obtained by adding tartaric acid of 3 parts by volume per hydrofluoric acid of 12 parts and nitric acid of 1 part. Another type of carboxylic acid may be used as long as it can adjust the etching rate.

In this embodiment, description has been made as to a case that a cast polycrystal silicon substrate is used. However, it has been confirmed that the same projection/recess structure is obtainable even in a case of using a single crystal silicon substrate or a thin silicon film having a thickness of 100 $\mu$m or less, or a thin polycrystal silicon film formed on a substrate of silicon carbide. Namely, the method of forming a projection/recess structure at the substrate surface of the present invention is applicable to any type of silicon substrate, e. g., single crystal, polycrystal, amorphous or the like so that the same effect is obtainable. A silicon substrate should have a thickness of 2 to 3 $\mu$m or more which is sufficient to form a projection/recess structure by etching.

Further, when a process of removing a brown or black colored deposit produced by etching with an aqueous alkali solution is conducted in a mixed solution prepared by adding isopropyl alcohol in the aqueous alkali solution, minute projections and recesses in a pyramidal shape are formed on a spherical projection/recess structure in a superposing state. The diameter of spherical projections and recesses is 8 $\mu$m or more. However, pyramidal projections and recesses each have sides of several $\mu$m. Accordingly, the shape of the substrate surface which further reduces reflection of light can be obtained.

In the above, description has been made as to steps of removing the deposit by dipping the silicon substrate in an aqueous caustic alkali solution, washing the substrate with water, and dipping the substrate in a mixed solution of caustic alkali and IPA(isopropyl alcohol) to form minute pyramidal projections and recesses. Instead of this process, it is possible to treat the substrate with a mixed liquid of caustic alkali and IPA.

Embodiment 2

An example of a method of producing a solar cell in which a surface active agent is added (in about 580 ppm) into an etching liquid of mixed acid containing hydrofluoric acid, nitric acid and phosphoric acid as major components, will be described.

An etching liquid of mixed acid comprising a 50% hydrofluoric acid, a 69% nitric acid and a 85% phosphoric acid in the proportions of 12 parts by volume, 1 part by volume and 12 parts by volume is prepared, and an nonionic surface active agent of about 580 ppm is added thereto. A cast silicon substrate is dipped in the etching liquid of mixed acid for a time sufficient to obtain a predetermined etching quantity while the liquid is maintained at the room temperature. After the etching, the substrate is quickly taken out from the etching liquid and is transferred to a water tank filled with washing water in which washing is conducted by continuously supplying water to remove the etching liquid on the substrate. If a brown or black colored deposit remains on the substrate surface after the etching, the substrate is dipped in an aqueous solution of caustic soda or caustic potash having a concentration of several % to several ten % for several seconds to several minutes, and the substrate is washed with water again.

Figure 6:
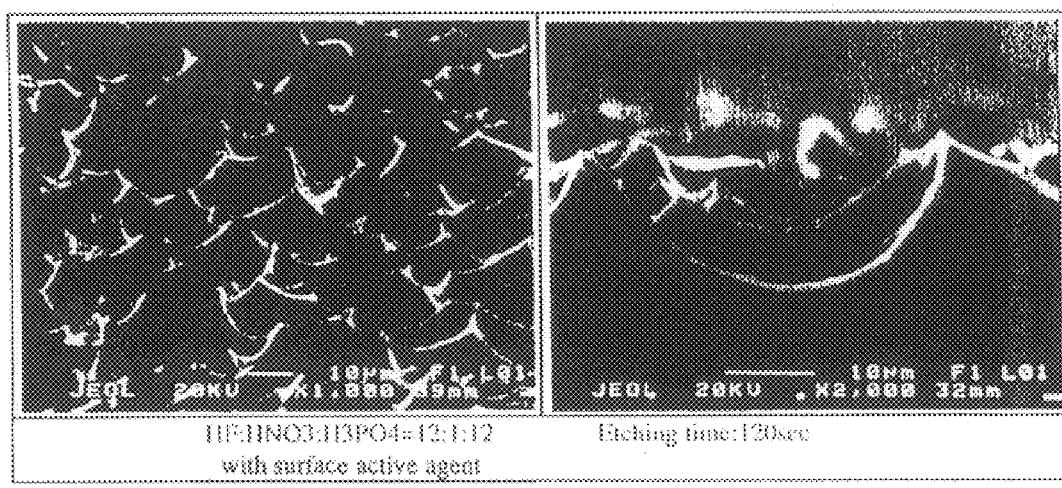
FIG. 6 is a diagram showing a projection/recess structure at a substrate surface in a case of adding a surface active agent (in the presence of a surface active agent) of the present invention.
Figure 7:
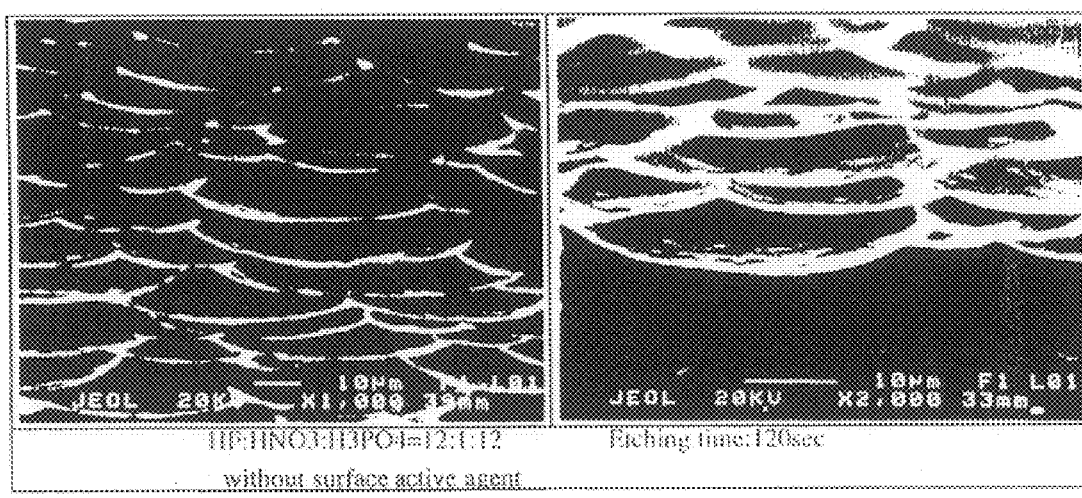
FIG. 7 is a diagram showing a projection/recess structure at a substrate surface in a case of adding a surface active agent (in the absence of a surface active agent) of the present invention.

As explained in Embodiment 1, minute projections and recesses can be formed in the substrate surface without adding the surface active agent. However, very minute projections and recesses and deeper recesses can be formed in the substrate surface by adding the surface active agent. In embodiment 1, the effect of forming minute projections and recesses is somewhat lesser in a region where crystal grain boundaries are dense, and as a result, some flat portions are left. However, when the surface active agent is added, a uniform projection/recess structure can be obtained. FIGS. 6 and 7 show results of the formation of a projection/recess structure in the presence and the absence of the surface active agent.

The surface active agent includes four types of agents: anionic, cationic, nonionic and amphoteric agents. Among these, the addition of the nonionic surface active agent could provide a substrate surface having the deepest recess and a low reflectivity. Further, when the anionic or the cationic surface active agent is added in addition to the nonionic surface active agent, the same effect as in the case of the sole use of the nonionic surface active agent could be obtained.

When the anionic or the cationic surface active agent was added independently, the size of projections and recesses to be formed was slightly larger than the size obtained in the case of adding the nonionic surface active agent, and there was a tendency of increasing the reflectivity of the substrate. However, the shape of the projections and recesses was fine and the reflectivity of the substrate was decreased in comparison with the case without adding the surface active agent.

Embodiment 3

An etching liquid of mixed acid comprising a 50% hydrofluoric acid, a 69% nitric acid and a 85% phosphoric acid in the proportions of 12 parts by volume, 1 part by volume and 12 parts by volume is prepared, and a nonionic surface active agent of about 580 ppm is added thereto. Further, ammonium fluoride of 30 g/l is added to the mixture. Then, a cast silicon substrate is dipped in the mixed etching liquid for a time to obtain a predetermined etching quantity while the liquid is kept at room temperature. After the etching, the substrate is quickly taken out from the liquid, and is transferred into a water tank filled with washing water in which washing is conducted by continuously supplying water to wash out the etching liquid on the substrate. However, if a brown or black-colored deposit remains on the substrate surface thus treated, the substrate is dipped in an aqueous solution of caustic soda or caustic potash having a concentration of several % to several ten % for several seconds to several minutes, and washing is conducted again to the substrate.

In this embodiment, the addition of ammonium fluoride slightly increased the height of the projections and the depth of recesses at the substrate surface and lowered reflectivity by 1.5% in comparison with that of Embodiment 2.

This embodiment concerns use of the aqueous solution of mixed acid containing phosphoric acid into which a surface active agent and ammonium fluoride (NH$_4$F) are added. However, the same effect can be obtained by using carboxylic acid instead of phosphoric acid. In such case, carboxylic acid of 30 g/l (in a range of 100 to 5000 ppm) can be added. The deposit can be removed with alkali having a low concentration such as caustic soda or caustic potash having a concentration of 50%, at the room temperature or at a higher temperature. However, use of the etching liquid at more than 95° C. is not practical from the viewpoint of handling. Further, the etching liquid having a high concentration is not economical.

Embodiment 4

An example of producing a solar cell by using a substrate wherein a minute projection/recess structure is formed in the surface according to the method described in Embodiment 2, will be explained.

Figure 8:
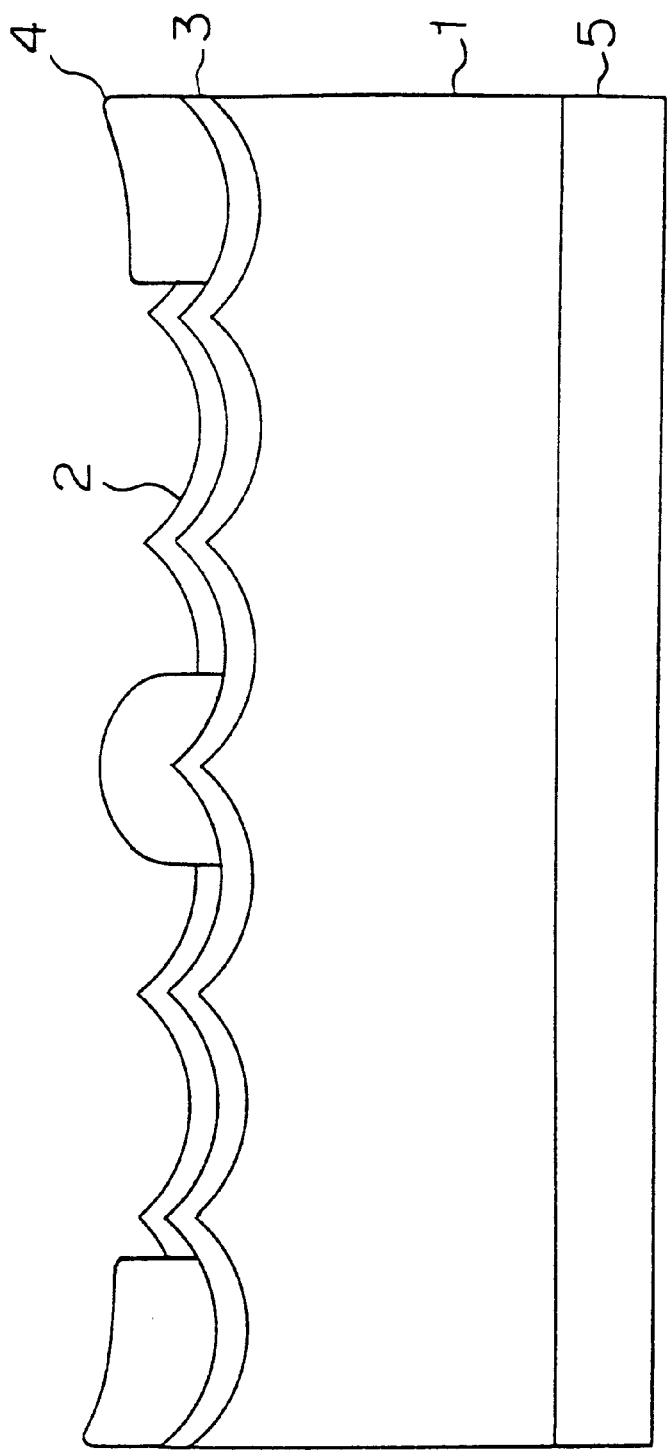
FIG. 8 is a diagram in cross section showing a silicon solar cell according to the present invention.

FIG. 8 is a cross-sectional view of an embodiment of the solar cell according to the present invention wherein numeral 1 designates a silicon substrate, numeral 2 designates an antireflection film formed on a plane to which light is incident, numeral 3 designates a n$^+$ diffusion layer, numeral 4 designates a grid-like n electrode formed by sintering a silver paste, and numeral 5 designates a p electrode formed on a rear plane by sintering an aluminum paste or an aluminum—silver paste.

The p type polycrystal silicon substrate 1 in which a minute projection/recess structure was formed as described in Embodiment 2 was put in a diffusion furnace in which phosphorous oxychloride (POCl$_3$) was used as a diffusion source, and phosphorous (P) was diffused by a vapor phase reaction to thereby form the n$^+$ layer 3 on a surface of the substrate 1. An etching resist was coated on a plane as a light receiving plane of the substrate 1. Then, the diffusion layer (n$^+$) at a rear plane was removed by etching with a mixed liquid of hydrofluoric acid and nitric acid. The etching resist was removed with isopropyl alcohol, and the substrate was washed with pure water. A silicon nitride film having a thickness of 750 Å was formed as the antireflection film 2 on the front surface side of the substrate by a vacuum CVD method. The antireflection film formed on the rear plane was removed by reactive-on etching. Finally, the grid-like n electrode 4 was formed on the front surface by using a silver paste, and the p electrode 5 was formed on the rear plane by a printing method of an aluminum paste or an aluminum—silver paste, followed by baking it at 700 ° C.

In comparison with the conventional method, a substrate in which projections and recesses were formed by alkali etching and a substrate in which the damaged layer was removed by mirror-surface etching with a mixed liquid of hydrofluoric acid and nitric acid were prepared, and solar cells were produced by using the same process as described in the previous embodiments by using the substrates.

Table 1 shows shortcircuit current values (Jsc) as the characteristic wherein the reflectivity of the solar cells is directly represented. Namely, Table 1 shows a comparison of the shortcircuit photocurrent density of the solar cell of the present invention with those of comparative examples.

TABLE 1

|  | Jsc [mA/cm$^2$] |
| --- | --- |
| Solar cell according to the present invention | 29.380 |
| Solar cell with a texture formed by using alkali | 28.472 |
| Solar cell with mirror surface | 27.998 |

The etching resist is to cover a portion where etching is not desired.

Minute projections and recesses can be formed on the substrate surface by etching with a mixed acid. Further, pyramidal projections and recesses can be formed with a mixed solution of caustic alkali and IPA. When both the above etching methods are used, reflection of light can effectively be utilized. Namely, projections and recesses are formed in the substrate surface by the etching with the mixed acid, and pyramidal projections and recesses are formed on the substrate surface with a texture with use of caustic alkali and IPA.

It has been expected that when alkali etching is conducted to a solar cell with a mirror surface having Jsc of about 28 mA/cm$^2$, Jsc is increased to about 28.5 mA/cm$^2$. On the other hand, in the solar cell having a surface structure in which spherical projections and recesses are formed, Jsc was increased to 29.4 mA/cm$^2$. Namely, an increase of efficiency of 3% or more could be achieved in comparison with the conventional techniques.

Figure 9:
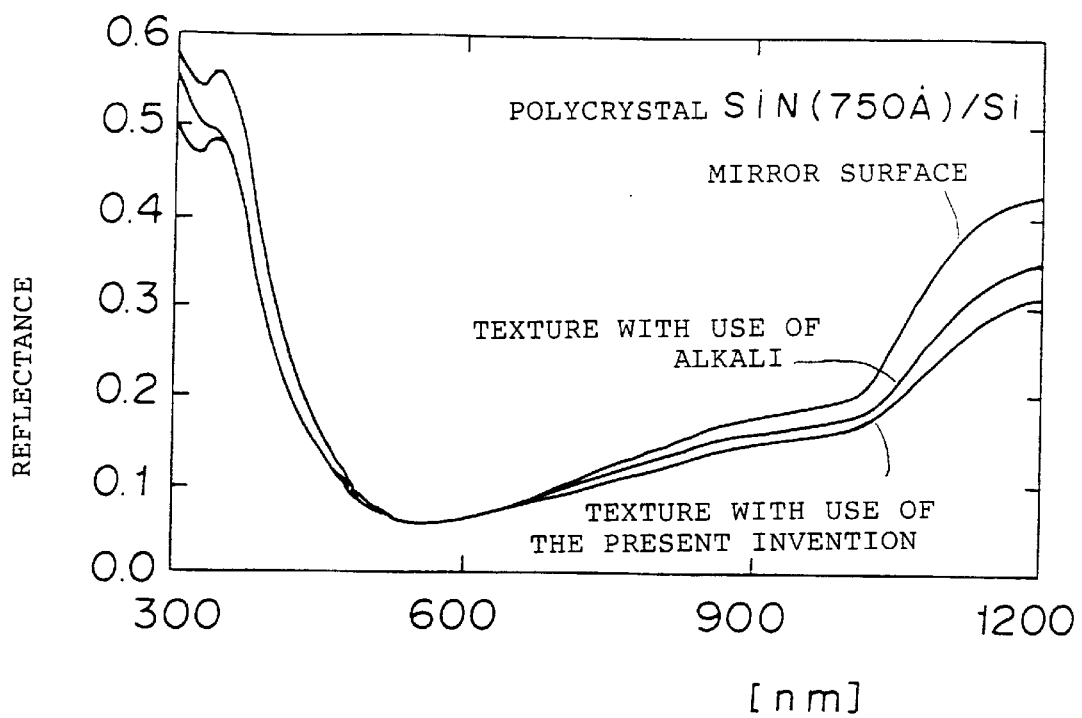
FIG. 9 is a diagram showing a change of reflectivity according to the treatment method of the present invention.

In order to clarify the cause, the reflectivity of silicon solar cells in an effective wavelength region was measured. FIG. 9 shows a result of the measurement in which a relation of the reflectivity of three solar cells to wavelength in shown. Namely, there is a large reduction of the reflectivity in the substantially entire wavelength region of the solar cell of the present invention in comparison with the conventional techniques.

Figure 10:
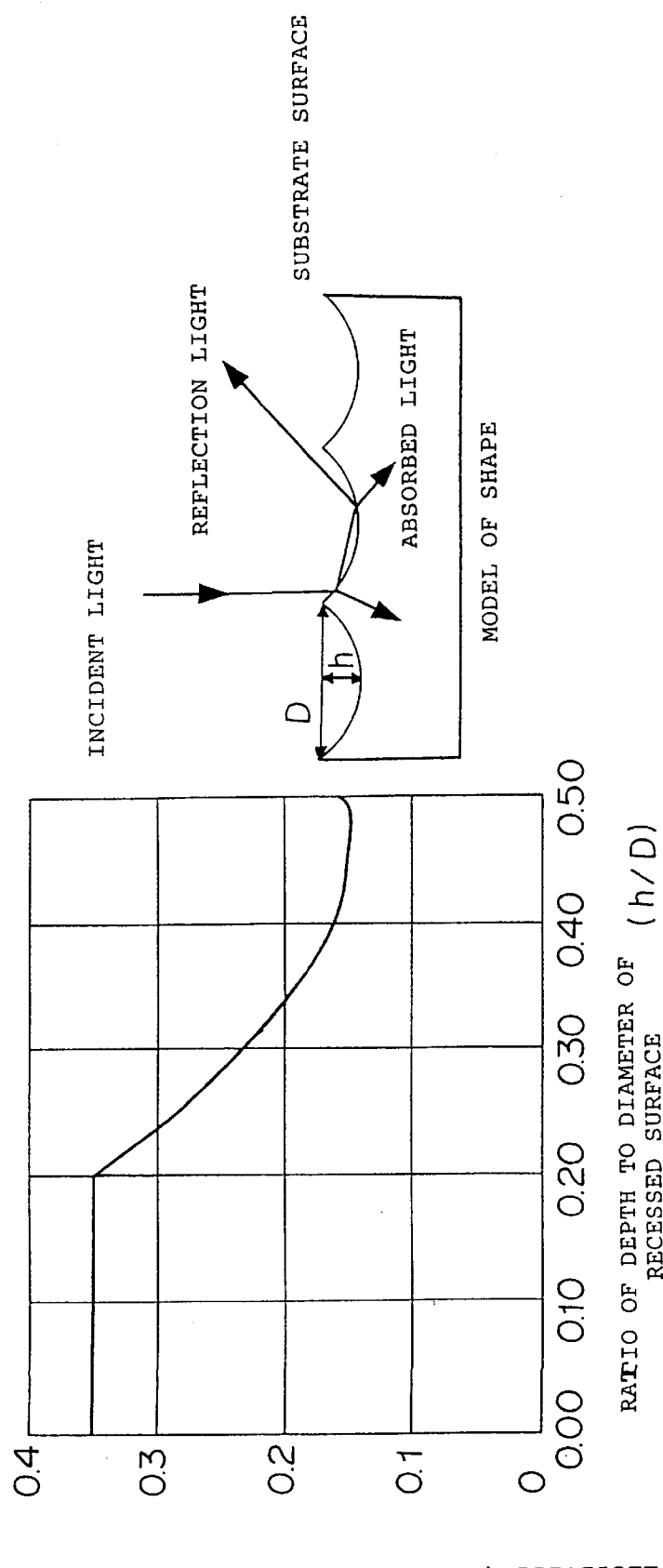
FIG. 10 is a diagram showing a relation (calculated values) of a basic projection/recess structure of a substrate surface to the reflectivity according to the present invention.

The above-mentioned is a result of actually treated substrates. In the next, effect of the solar cell of the present invention is shown with numerical values in correlation with a result obtained by calculating optically the relation of a spherical shape and reflectivity. In calculation, the reflectivity of vertically incident light (a monochromatic light having a wavelength of 600 nm) was obtained wherein the ratio of the depth (h) of spherical recess to the diameter (D) was used as a parameter. Further, calculation was conducted with the assumption that the shape of the projections and recesses was uniformed. FIG. 10 is a diagram showing a result.

FIG. 10 clearly shows that when h/D is 0.2 or lower, the reflectivity is 0.35 which is a substantially constant value, and when h/D is 0.2 or more, the reflectivity tends to decrease. When h/D is 0.48, the reflectivity indicates 0.15 as the minimum value, and when h/D=0.5, it slightly increases. An edge portion of recesses becomes sharp when h/D exceeds 0.45 whereby there is a problem in forming electrodes in the postprocess. Accordingly, for improving the efficiency of the solar cell having a projection/recess structure, h/D should be in a range of from 0.2 to 0.45.

Even in a case that the rear plane to which no light is incident has the same projection/recess structure as the front plane, there is found no substantial difference in the characteristics of the solar cell. However, such case requires an excessive amount of material for electrodes since the surface area of the rear plane is large in forming electrodes, and position of the electrodes is unstable due to the presence of sharp edges. Accordingly, the absence of the projection/recess structure in the rear plane is desirable from the standpoint of reducing manufacturing cost and a uniform quality of the solar cell.

The spectra of sun light on the earth is in a range of wavelength of about 300 to 2500 nm. Spectra effective to a silicon solar cell are lights having a wavelength of about 300 to 1200 nm.

Embodiment 5

Figure 11:
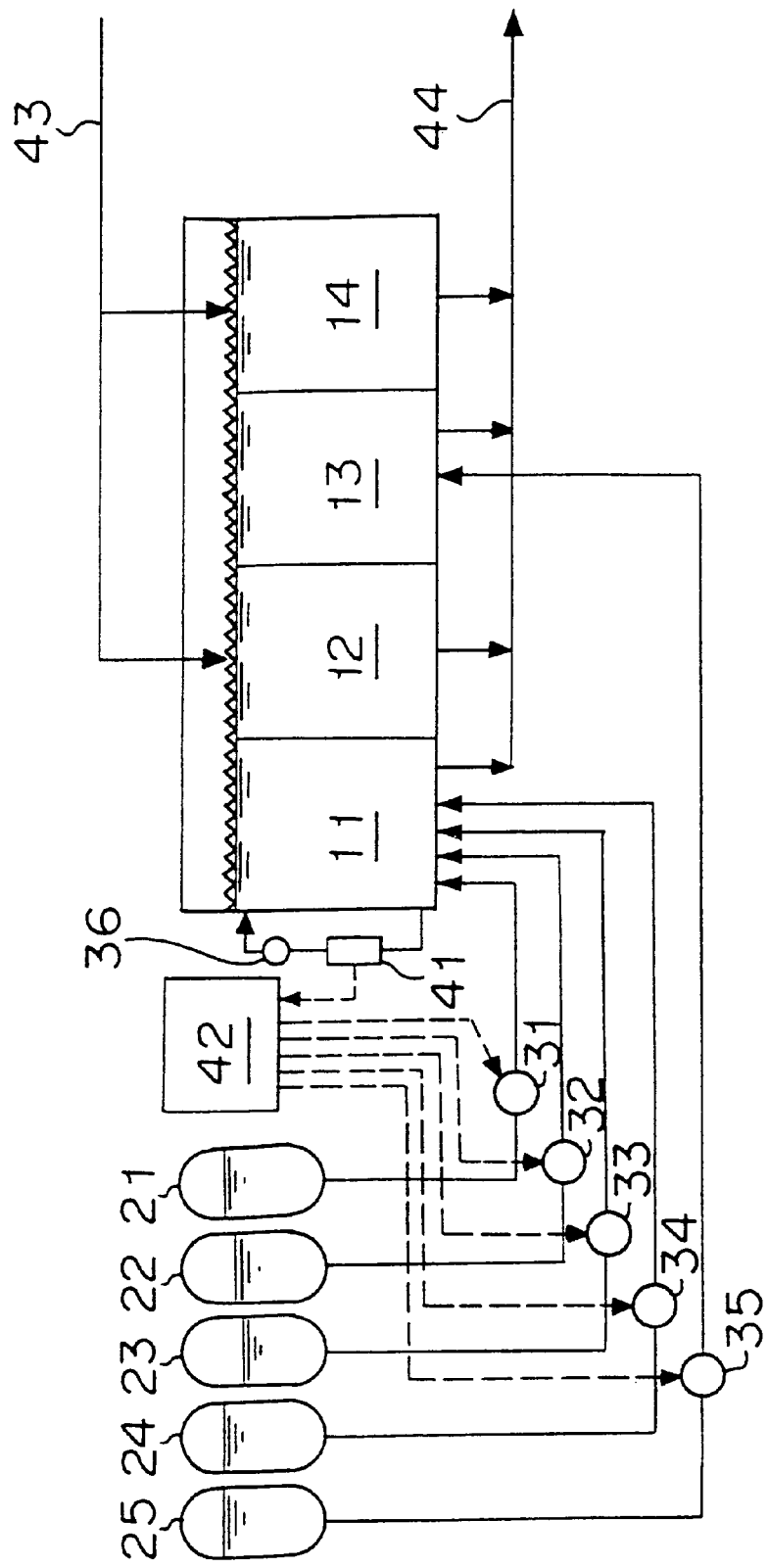
FIG. 11 is a diagram showing a construction in cross section of a wet type etching apparatus of the present invention.

An example of a wet type etching apparatus will be described. FIG. 11 is a diagram showing an embodiment of a wet type etching apparatus in cross section for forming a minute projection/recess structure in a silicon substrate according to the present invention. In FIG. 11, reference numeral 11 designates a first etching tank for conducting etching with a mixed solution composed mainly of hydrofluoric acid, nitric acid and phosphoric acid, numeral 12 designates a first water tank for washing a substrate with water which has been subjected to a treatment with the mixed aqueous solution, numeral 13 designates a second etching tank for conducting etching with an aqueous caustic alkali solution in order to remove a film formed on the substrate surface, numeral 14 designates a second water tank for washing the substrate which has been subjected to the treatment with the aqueous caustic alkali solution, numeral 21 designates a storage tank for an aqueous hydrofluoric acid solution, numeral 22 designates a storage tank for nitric acid, numeral 23 designates a storage tank for phosphoric acid, numeral 24 designates a storage tank for an aqueous ammonium fluoride solution, numeral 25 designates a storage tank for caustic soda, numerals 31, 32, 33, 34 and 35 designate supply pumps for measuring and supplying aqueous solutions of hydrofluoric acid, nitric acid, phosphoric acid, ammonium fluoride and caustic soda respectively. The storage tanks 21 to 25 are connected to supply pumps 31 to 35 with pipes respectively. The supply pumps 31 to 34 are connected to the first etching tank 11 with pipes, and the supply pump 35 is connected to the second etching tank 13 with a pipe. Numeral 36 designates a circulating pump which is connected to the first etching tank 11 with a pipe so as to draw liquid in the first etching tank 11 from its lower potion and return the liquid to the upper portion of the first etching tank 11. Numeral 41 designates a detector for detecting a concentration of nitric acid, which is disposed between the first etching tank 11 and the circulating pump 36. Numeral 42 designates a control device constituted by, for instance, a personal computer, which is connected to the nitric acid concentration detector 41 so as to receive signals of the concentration. The control device 42 is connected to the supply pumps 31 to 35 with signal wires so as to send instructions of supply and stop of the solutions. numeral 43 designates a washing water supply system to supply washing water to the first water tank 12 and the second water tank 14. Numeral 44 designates a drain pipe system to drain liquids from the tanks.

Operations of the wet type etching apparatus will be described. The control device 42 outputs a signal to each of the supply pumps 31 to 35 to start operations, whereby hydrofluoric acid, nitric acid, phosphoric acid and ammonium fluoride are supplied to the first etching tank 11 in which a predetermined composition is obtainable. The second etching tank 13 is supplied with a predetermined amount of the aqueous caustic soda solution. In this state, a cassette in which a plurality of substrates are held is dipped in the first etching tank 11 whereby etching for the damaged layers in the substrate surfaces is effected along with the formation of a projection/recess structure in each of the substrate surfaces. After this, the substrates held in the cassette are transferred to the first water tank 12 which is filled with washing water and is usually supplied with washing water. Accordingly, the substrates and the cassette are washed in the water tank, and hydrofluoric acid and other compounds deposited on the substrates at the previous step are removed. Then, the cassette in which the substrates are held is dipped in the second etching tank 13. A brown or black-colored thin film of impurity may be formed on the substrate surface when etching is effected for the damaged layers in the substrate surfaces along with the formation of a projection/recess structure in the substrate surface. Such thin film of impurity can easily be removed by dipping the substrates in the aqueous caustic soda solution in the second etching tank 13. After the thin film of impurity on the substrate surfaces has been removed, the cassette holding the substrates therein is transferred from the second etching tank 13 to the second water tank 14 in which the aqueous caustic soda solution on the substrates is washed. Thus, the treatment of etching of the damaged layers in the substrate surfaces and the treatment of forming the projection/recess structure in the substrate surfaces are finished. The above-mentioned treatments are continuously conducted to other substrates.

During the continuous treatments, chemical solutions in the first and second etching tanks 11, 13 are consumed. In particular, an amount of nitric acid in the first etching tank 11 is the least in view of the ratio of mixing (hydrofluoric acid:nitric acid:phosphoric acid=12 parts:1 part:12 parts), and therefore, a variation of the concentration is remarkable. The nitric acid is essential from the mechanism of an etching reaction. When the concentration decreases, a rate of reaction largely varies or the reaction is stopped.

Accordingly, it is essential to always maintain a predetermined concentration of nitric acid. The nitric acid concentration detector 41 is always supplied with the etching liquid in the first etching tank 11 to measure a concentration of nitric acid in the liquid. Data of the concentration are supplied to the control device 42. When the control device 42 detects that a concentration of nitric acid is lower than a predetermined value, it drives the supply pump 32 to start a supply of nitric acid to the first etching tank 11 so that a predetermined concentration of nitric acid can be maintained in the first etching tank 11. The control device 42 stops the supply pump 32 when a concentration of nitric acid reaches the predetermined value. Thus, by repeating the above-mentioned operations, the concentration of nitric acid in the first etching tank 11 can be kept constant, and it is possible to obtain a silicon substrate surface having a low reflectivity.

In the above-mentioned, a stable and quick etching treatment is conducted by using a system of supplying nitric acid since a consumption rate of nitric acid is faster than that of other acids.

The total quantity of liquid is renewed for hydrofluoric acid, phosphoric acid and carboxylic acid. The etching of silicon is conducted according to a mechanism that the silicon is oxidized by nitric acid and the silicon is removed by hydrofluoric acid. Phosphoric acid and carboxylic acid do not contribute the etching and are used as buffering agents. It is therefore considered that there is no consumption of phosphoric acid and carboxylic acid, and accordingly, it is not always necessary to detect the concentration of these acids.

For hydrofluoric acid and caustic soda, when a predetermined number of substrates are treated, the entire quantity of the liquids is replaced to thereby avoid a reduction of a reaction rate due to the consumption of these liquids and to continue a stable treatment.

When a surface active agent is to be added, a storage tank and a supply pump may be disposed for a sole use for the surface active agent in the same manner as the other chemical liquids. However, since an amount of the surface active agent to be added is smaller that an amount of the other chemical liquids, the surface active agent may be dissolved to any of the other liquids so as to be supplied.

Further, the measurement and the control of the concentration may be conducted to hydrofluoric acid and phosphoric acid other than nitric acid. In this case, a better result is obtainable.

When isopropyl alcohol is supplied to the second etching tank 14 and the substrates are dipped in it for a longer time, a pyramidal projection/recess structure can be formed on the spherical projection/recess structure in a superposing state in addition to the removal of the thin film of impurity formed on the substrate surfaces. In this case, the wet type etching apparatus of the present invention as described above can be used without a substantial change.

The detection of the concentration of nitric acid can be conducted by a method of defecting a quantity of ultra violet absorption of nitric acid ions ($NO_3^-$) and nitric acid ($HNO_3$) in the liquid, or a method of measuring an oxidation reduction potential because nitric acid functions as an oxidizer.

Embodiment 6

Figure 12:
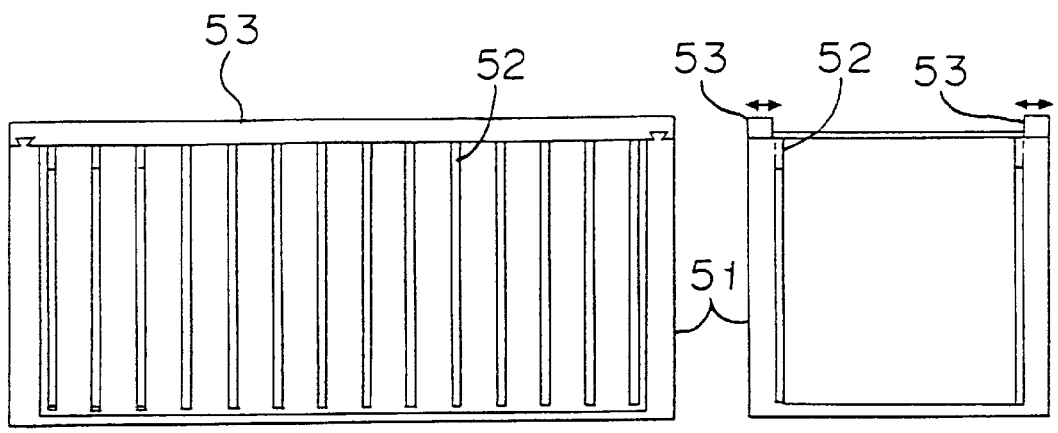
FIG. 12 is a diagram of the construction in cross section of a substrate holding cassette of the present invention.
Figure 13:
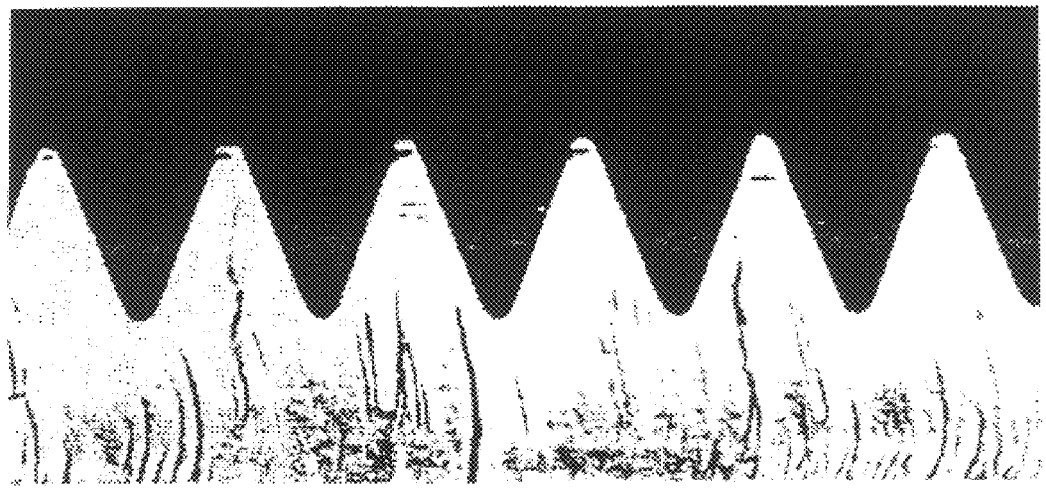
FIG. 13 is a diagram showing V-like grooves in cross section formed in a conventional substrate.
Figure 14:
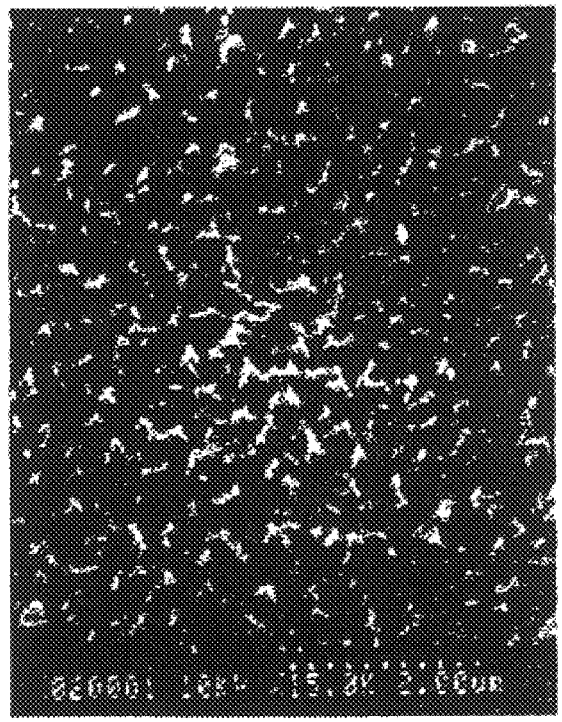
FIG. 14 is a diagram showing a projection/recess structure formed in a conventional polycrystal silicon wafer.

Description will be made as to the cassette which holds substrates, as described in Embodiment 5. FIG. 12 shows in cross section a cassette for receiving therein substrates. Numeral 51 designates the main body of the cassette, numeral 52 designates a groove permitting insertion of a substrate, and numeral 53 designates a fixing jig provided at an upper portion of the cassette.

Operations of the cassette will be described. Each substrate is inserted into each groove 52 to be received in the cassette. After all substrates have been inserted, the fixing jig 53 provided at the upper portion of the cassette is moved by sliding so that the substrates can be retained inside the cassette. Then, the cassette is dipped in the etching tank in a state that the substrates are vertically oriented. The process following thereafter is the same as in Embodiment 5 and therefore, description is omitted.

Generally, there is found a large quantity of air bubbles during the etching reaction. A part of air bubbles attaches to the substrate surface to give buoyancy to the substrate itself. However, since the substrates are held in the cassette by means of the fixing jig at the upper portion of the cassette, a stable treatment can be carried out without a danger of escaping of the substrates from the cassette.

If the substrates are arranged in horizontal direction, it is difficult for the air bubbles to separate from the substrates, and bubbles gather on each of the substrates to form large-sized bubbles. The shape of spherical projections and recesses formed in the substrate surface coincides with the shape of the bubbles attached to the surface. When the bubbles grow to be large-sized bubbles, the size of the projection/recess structure formed in the silicon substrate surface becomes large and assumes a shallow shape, which is undesirable from the viewpoint of the reflectivity. Namely, by setting the substrates in the vertical direction, the substrate surfaces each having an effective projection/recess structure can be obtained. The reason why the wafers are vertically arranged is that the generation of air bubbles in the etching treatment is considered to derive from the projection/recess structure formed in the surface. Accordingly, when the etching treatment is conducted in a state that the wafers are held in the horizontal direction, the shape of the projections and recesses in the substrate surface becomes unstable.

The above-mentioned cassette and the jig attached thereto are required to have a chemical resistance to chemicals such as nitric acid, hydrofluoric acid, caustic alkali and so on, and they should be made of material such as tetrafluoroethylene, trifluoroethlene or the like.

In this embodiment, the fixing jig 53 is so adapted to be fitted to the groove so that the movement of the substrate is controlled by sliding the fixing jig 53. However, the same effect can be obtained by providing a rotating structure wherein a member can be moved to a position so as to control the movement of the substrates.

Embodiment 7

Another embodiment of the cassette for holding the substrates will be described. In this embodiment, the shape of the cassette is similar to that shown in FIG. 12 with respect to Embodiment 6. In Embodiment 6, the width of the groove 52 permitting the insertion of a substrate is determined in consideration of the thickness of a single substrate, a quantity of bend of the substrate and so on. Further, the distance between grooves is determined in consideration of uniformity of the reaction. In this embodiment, however, the width of each groove is so determined that two substrates can be inserted together, and the distance between grooves is the same as in Embodiment 6. When the cassette in which two substrates are put in each of the grooves so that the opposing surface of the two substrates in the same groove is in mutually close contact, is dipped in the etching liquid, the reaction at the surfaces which do not contact to the liquid is suppressed because there is a restriction in supplying the etching liquid. Even when there occurs the reaction at the mutually contact surfaces in the same manner as other surfaces exposed to the etching liquid, air bubbles produced by the reaction are maintained between the mutually contacting surfaces, and the etching liquid is expelled by the bubbles in the cause of the reaction, and the reaction is stopped. The substrate treated in such state has a front surface in which a projection/recess structure is formed as usual and a rear surface in which there is substantially no projection/recess structure because the reaction is suppressed. An electrode can be formed on the rear surface having a smooth plane whereby a solar cell having high reliability is obtainable, further, productivity is increased because a plural number of substrates can be treated together in the same cassette.

In the solar cell having a silicon substrate with a projection/recess structure at its front surface produced by the method of the present invention, since light reflected at the front surface is incident again into the front surface, light quantity confined in the solar cell is increased. Accordingly, a large amount of light is well absorbed in the solar cell to thereby improve the performance. In particular, in case of using a substrate of polycrystal silicon, a minute projection/recess structure can be formed uniformly in the plane without producing an undesired shoulder portion. Accordingly, a further efficient power generation can be obtained in comparison with the conventional method.

Further, since the process rate can be adjusted to a range in which control is easy, a stable process can be expected, and a problem of a defect in products due to a narrower range of control in the conventional method and a problem of low productivity due to a slow treatment speed can be eliminated. The reduction of the reflectivity required for a solar cell is needed only for a plane to which light is incident, and rear surface should be flat because it is easy to form the electrode. These requirements are satisfied by applying the embodiments of the present invention.

In the first aspect of the present invention, a minute projection/recess structure can be formed in the substrate surface of a solar cell in a stable manner. Accordingly, a method of manufacture of the solar cell having high light confining effect can be obtained with high productivity.

In the second aspect of the present invention, a minute projection/recess structure can be formed in the substrate surface of a solar cell at a high rate. Accordingly, a method of manufacture of the solar cell having high utility can be obtained by a large scale production.

In the third aspect of the present invention, the addition of ammonium fluoride provides a solar cell with further efficiency.

In the fourth aspect of the present invention, a widely utilizable method of producing a solar cell can be obtained because selection is possible from many kinds of chemicals.

In the fifth aspect of the present invention, the uniformity is improved by the addition of a surface active agent, and a solar cell having high efficiency can be obtained.

In the sixth aspect of the present invention, a solar cell having high efficiency can be obtained since selection is possible from a many kinds of chemicals.

In the seventh aspect of the invention, a stable manufacturing method is obtainable since a deposit can be removed with caustic alkali.

In the eighth aspect of the invention, easy handling and quick treating become possible.

In the ninth aspect of the invention, the efficiency of a solar cell can improve by forming minute projections in a superposing state on a projection/recess structure in the substrate surface which has been formed by etching with a mixed acid.

In the tenth aspect of the invention, a simultaneous treatment of a plural number of substrates increases efficiency of a large scale production.

In the eleventh aspect of the invention, a solar cell having a performance of confining light can be obtained since a spherical recess wherein the ratio of the depth to the diameter is in a range of from 0.2 to 0.45 is continuously formed in a surface of a silicon substrate.

In the twelfth aspect of the invention, an inexpensive solar cell can be obtained.

In the thirteenth aspect of the invention, a solar cell having high efficiency is obtainable.

In the fourteenth aspect of the invention, an apparatus for producing a semiconductor having a stable quality is provided.

In the fifteenth aspect of the invention, an apparatus for producing a semiconductor as a stable product is provided.

In the sixteenth aspect of the invention, an apparatus for producing a semiconductor having high reliability and a stable quality is provided.

In the seventeenth aspect of the invention, an apparatus for producing a semiconductor in a large scale production is provided.

Obviously, numerous modifications and variations of the present invention are possible in light of the above teachings. It is therefore to be understood that within the scope of the appended claims, the invention may be practiced otherwise than as specifically described herein.

What is claimed is:

1. A solar cell comprising a substrate of single crystal or polycrystal, the solar cell having a plurality of spherical recesses wherein a ratio of a depth to a diameter of the spherical recesses in a range of 0.2 to 0.45 and wherein the plurality of spherical recesses are continuously formed in a surface of the substrate.

2. The solar cell according to claim 1, wherein the plurality of spherical recesses are continuously formed in at least a surface to which light is incident.

3. The solar cell according to claim 1, wherein minute pyramidal projections and recesses are further formed in the surface of the substrate in which spherical recesses are formed.

* * * * *